United States Patent [19]

Snijders et al.

[11] 4,003,002
[45] Jan. 11, 1977

[54] MODULATION AND FILTERING DEVICE

[75] Inventors: Wilfred André Maria Snijders; Nicolaas Alphonsus Maria Verhoeckx; Petrus Josephus van Gerwen; Hendrik Arie van Essen, all of Eindhoven, Netherlands

[73] Assignee: U.S. Philips Corporation, New York, N.Y.

[22] Filed: Aug. 27, 1975

[21] Appl. No.: 608,392

[30] Foreign Application Priority Data

Sept. 12, 1974 Netherlands .................. 7412095

[52] U.S. Cl. .................................. 332/10; 176/66; 325/30; 325/163
[51] Int. Cl.² ......................................... H03K 7/00
[58] Field of Search .......... 325/30, 163; 176/66 R; 332/9, 9 T, 10

Primary Examiner—John Kominski
Attorney, Agent, or Firm—Frank R. Trifari; Simon L. Cohen

[57] ABSTRACT

A digital data transmitter is described, whose line carrier frequency need not be an integral multiple of one half the clock frequency of the digital input signal. Use is made of a digital filter for increasing the sampling frequency to a value which is twice the modulator carrier wave frequency.

1 Claim, 5 Drawing Figures

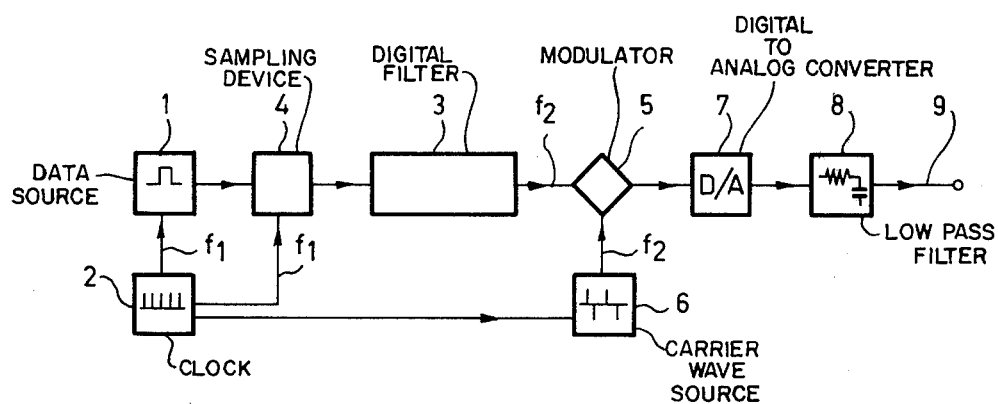
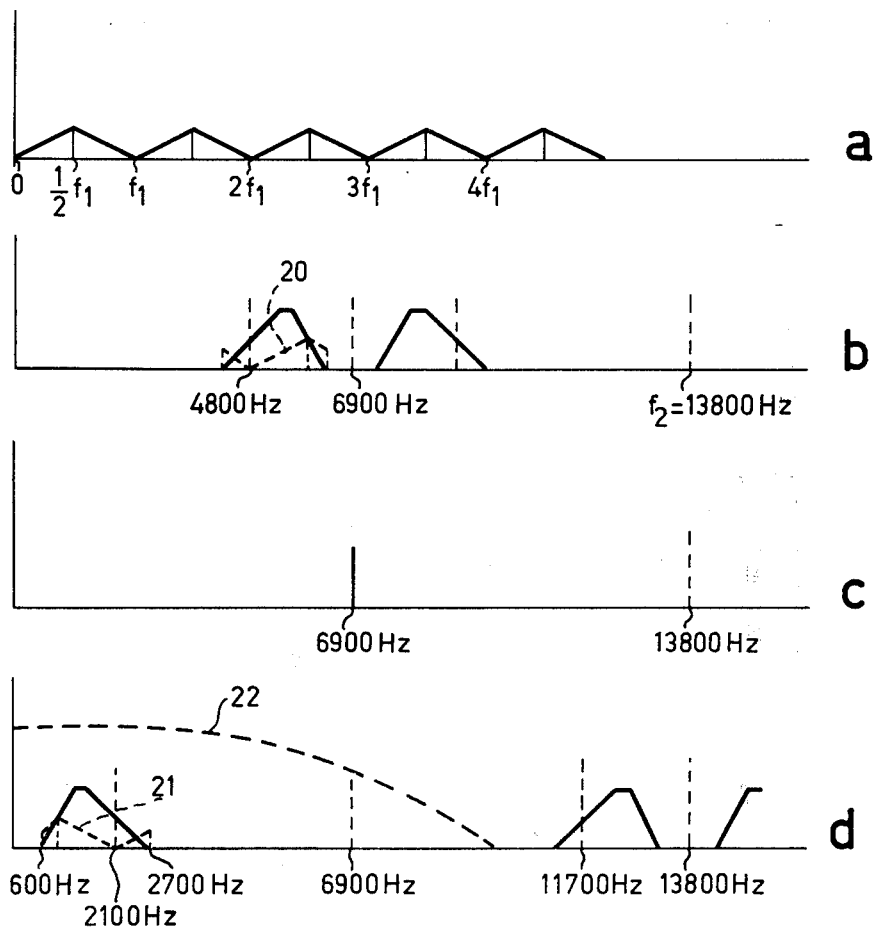

MODULATION AND FILTERING DEVICE

BACKGROUND OF THE INVENTION

1. Field of the Invention

The invention relates to the modulation and filtering of digital signals, in particular of signals which are usually called binary data signals.

Data signals, which consist of a succession of signal elements of uniform duration whose amplitude represents a binary "0" or binary "1", are not simply suitable for transmission via, for example, a telephone channel. It has therefore become normal practice to use so-called "modems" in which the data signals before transmission modulate a carrier wave and in which after reception the modulated signal is demodulated.

Any of the well-known modulation techniques such as FSK, PSK, AM-DSB, AM-SSB, AM-USB can be used for the realization of a frequency spectrum suitable for transmission via a telephone channel.

The invention results from investigations in the field of a 2400 Baud AM-VSB modem, but is not restricted to this field alone, as the same principles can be used for other data speeds and for other linear modulation methods such as AM-DSB, AM-SSB, FSK (modulation-index ½) and PSK. Although in what follows hereafter, reference is made to a 2400 bit/sec AM-VSB modem and its extension to a 4800 bit/sec AM-VSB modem this should not be interpreted as a restriction of the possibilities of application of the principles according to the invention.

2. Description of the State of the Art.

According to a frequently used method in conventional AM-VSB modems the data signals are first filtered in a low-pass filter. The filtered signals modulate a carrier wave in amplitude and, of the sidebands of the modulated signal, one of the sidebands plus a part of the other sideband is selected by a vestigial sideband filter whose output signal is transmitted.

The low-pass filter causes a limitation of the frequency spectrum of the data signals at the side of the high signal frequencies. At the, with regard to the highest data signal frequency, relatively low carrier frequency of data modems for telephone channels, the low-pass filter also prevents the phenomenon of foldover which occurs when high signal frequencies are superimposed, after modulation on a carrier wave, in the area which is occupied by the lower signal frequencies after modulation.

The low-pass filter is usually called the pre-modulation filter and the vestigial sideband filter the post-modulation filter. Modulation takes place between these two filters.

The output signal of the pre-modulation filter is an analog signal, even when the input signal is a binary signal, so that an analog modulator must be used.

It has been proposed to replace the analog modulator by a simple logic circuit and to interchange the order of the steps of pre-modulation filtering and modulation in order to profit from the binary form of the input signal. It has been proved that it is only possible to interchange these steps when the carrier frequency amounts to an integral multiple of one half the clock frequency of the digital input signal. Only in this case the resulting foldover distortion can be compensated by a linear network.

For practical purposes this is of limited importance, as may appear from a provisional proposal by the CCITT for a 4800 bit/sec AM-VSB modem, that this modem must have a carrier frequency of 2100 Hz, which is not in the said proportion to the clock frequency (in this case 2400 Hz at four-level coding).

Interchange of the steps so pre-modulation, filtering and modulation, which is only permissible in a limited number of cases, results in that only one filter is still needed, namely a post-modulation filter. This filter can be designed in such a way that the foldover distortion is compensated by it.

By realizing the post-modulation filter as a binary transversal filter, a data modem can be realized in the proposed manner from digital integrated circuits.

According to another line of development and with the purpose of mitigating the requriements the post-modulation filter must satisfy it has been suggested to realize the pre-modulation filter as a band filter. This proposal is based on the fact that by the use of short pulses for the representation of the binary information the signal energies at the higher frequencies, which also fully represent the binary information, are amplified. By selecting these higher-frequency signal components, a signal is obtained such that after modulation the sidebands thus created can be separated in a simple manner.

SUMMARY OF THE INVENTION

The invention has for its object to provide a digital data transmitter, in which the line carrier frequency need not be an integral multiple of one half the clock frequency.

The invention has for its further object to realize such a digital data transmitter with the least possible technical means and, in particular, to mitigate the requirements for the postmodulation filter to such a degree that a simple RC network will do.

The modulating and filtering device according to the invention is characterized in that the signal samples of the digital input signal which occur at a first sampling frequency are converted in a digital filter to signal samples at a second sampling frequency, which is twice the modulator carrier freuency and the signal samples at the second sampling frequency are modulated in a modulator by signal samples of the modulator carrier wave which occur at the same second sampling frequency, the digital filter being adapted to have a band-pass filter characteristic.

In this digital transmitter the modulator carrier wave is sampled at a frequency which is twice the modulator carrier frequency, so that the samples of the carrier wave can be represented in numerical form by the numbers +1, −1, +1, −1, . . . The modulation process then limits itself to an alternating inversion of the signal samples which have been derived from the digital input signal by the digital bandpass filter.

In its simplicity this digital modulation can be compared to the modulation which is used in the system mentioned above in the chapter: "state of the art" in which the steps of modulation and filtering are interchanged. However, in the digital transmitter according to the invention no special requirements are imposed upon the carrier wave in relation to the clock frequency or sampling frequency of the digital input signal.

The ratio between the second and the first sampling frequencies can be a whole number in which case the digital filter can be realized as an interpolating filter. It the ratio is not integral in which case it can be expressed by: M/L, where M and L are mutually indivisible integers, the digital filter can be realized as a cascade of and interpolating filter with interpolation factor M and an extrapolating filter having the extrapolation factor L. By way of alternative an interpolating digital filter, having an interpolation factor M/L, as described in the copending patent application (PHN 7729) may be used.

REFERENCES

"Digital filtering of band-limited signals: Interpolation, ectrapolation and distortions due to various truncations. Reduction of Computation speed in digital filters" by M. Bellanger, J. L. Daquet, G. Lepagnol, ICC June 11-13 1973, pages 23-11 to 23-15.

"Terminology in digital signal processing". IEEE Transactions on Audio and Electroacoustics, Vol. AV-20, No. 5, December 1972, pages 322–337.

"A digital signal processing approach to interpolation" by R. W. Schafer, L. R. Rabiner. Proceedings of the IEEE, Vol. 61, No. 6, June 1973, pages 692–702.

U.S. Pat. No. 3,611,143.

LIST OF ABBREVIATIONS

FSK — "frequency shift keying"
PSK — "phase shift keying"
AM — "Amplitude modulation"
DSB — "double sideband"
VSB — "vestigial sideband"
SSB — "single sideband"

DESCRIPTION OF THE EMBODIMENTS

1. General description

FIG. 1 shows the digital data transmitter, comprising a source of binary data signals 1. Purely for illustrative purposes, the speed of the data source 1 is set at 2400 bit/sec. This data source supplies 2400 binary signal elements per second, each signal element having a duration $T_1 = 1/2400$ sec.

The data source 1 is controlled by a clock 2 which supplies a clock signal of a clock frequency $f_1 = 2400$ Hz, to data source 1.

By 3 is indicated a digital filter. This filter may be constructed in known manner. The output sampling frequency if the digital filter is equal to $f_2$. Hereinafter, this frequency will be further determined. As is known, a digital filter has a transfer function with a periodic variation, whose period is equal to the sampling frequency, in this case equal to $f_2$. The part of the frequency characteristic between $-\frac{1}{2}f_2$ and $+\frac{1}{2}f_2$ is repeated from $nf_2 - \frac{1}{2}f_2$ to $nf_2 + \frac{1}{2}f_2$, where $n$ is any integer. By a suitable choice of the filter coefficients, it may be achieved that the part of the transfer function between $-\frac{1}{2}f_2$ and $+\frac{1}{2}f_2$ obtains a certain desired shape, for example corresponding to that of a VSB filter.

A sampling device 4 admits samples of the data signal to the digital filter 3 at the sampling frequency $f_1 = 2400$ Hz. Each signal element is sampled once in order to ascertain whether the signal element represents a binary "0" or a binary "1" and the corresponding value is entered in the digital filter 3.

Reference 5 designates a modulator and reference 6 a carrier wave source. This carrier wave source delivers, at the sampling frequency $f_2$, signal samples of a carrier wave of the carrier frequency $\frac{1}{2}f_2$. These carrier wave samples can be represented in numerical form by the numbers $+1, -1, +1, -1, \ldots$ Modulator 5 multiplies each signal sample of the digital filter 3 by a carrier wave sample and feeds the results to the digital-to-analog converter 7.

In the digital filter 3 and in the digital modulator 5 signal samples are treated in the form of code words which represent numbers. These code words are converted to a corresponding amplitude value of a current or voltage by digital-to-analog converter 7 and are normally kept at this value during the sampling period. The quantized signal obtained in this manner is fed to a low-pass filter 8, which passes the lower sideband of the quantized signal and suppresses the other sideband. The output of the filter is connected to a transmission line 9.

2. Operation

FIG. 2a shows a diagrammatical representation of a part of the frequency spectrum of a digital signal composed of discrete time pulses at mutual distances $T_1 = 1/f_1$, as this signal appears at the output of sampler 4.

FIG. 2b shows a part of the transfer function for positive frequencies of the digital filter 3, with an output sampling frequency $f_2 = 13800$ Hz. The part for the negative frequency is the mirror image about the frequency zero of the part for the positive frequencies. the "folding" frequency $\frac{1}{2}f_2$ is 6900 Hz. The transfer function between $-\frac{1}{2}f_2$ and $+\frac{1}{2}f_2$ has the shape of a VSB filter for a "carrier frequency" $2f_1 = 4800$ Hz. In FIG. 2b a dashed line 20 indicates the part of the spectrum of FIG. 2a which is encompassed by the VSB filter.

FIG. 2c shows the frequency spectrum of a digital signal that consists of discrete time pulses at mutual distances $T_2$ " $1/f_2$, which have alternately the value +1 and −1. This spectrum consists of spectral lines spaced at $f_2 = 13800$ Hz. This corresponds to the spectrum of the carrier wave samples at the output of carrier wave source 6.

FIG. 2d shows in the frequency domain the result of the multiplication of the output signal samples of digital filter 3 by the carrier wave samples of carrier wave source 6 in the modulator 5. The dashed line 21 corresponds to line 20 of FIG. 2b and illustrates the new position of the relevant part of the frequency spectrum of the data signal.

Normally, the digital-to-analog converter 7 converts each output signal sample of modulator 5 to a signal element of duration $T_2$ and constant amplitude during this time. This introduces in the frequency domain a $\sin x /x$ -shape factor whose first zero point is at 13800 Hz. Owing to this shape factor the higher-frequency components of the spectrum according to FIG. 2d are already attenuated with respect to the lower-frequency components in the 600–2700 Hz band. A further suppression can be realized with the aid of RC-filter 8 whose transfer function is illustrated by the dashed line 22 in FIG. 2d.

As will be clear from FIG. 2d, the output signal of filter 8 has the form of a VSB signal with a line carrier frequency of 2100 Hz and, by way of illustration, a sideband of 2100 Hz to 600 Hz and a vestigial sideband of 2100–2700 Hz.

4800 bit/sec data transmitter

A 4800 bit/sec data transmitter with the same frequency spectrum as the 2400 bit/sec data transmitter according to FIG. 1 can be realized by the use of dibit-coding at the input of the data transmitter. In accordance with this coding, the signal elements of the data source are divided in groups of two signal elements and the latter are coded in the dibit-coder according to the following rule:

| input dibit | output dibit | numerical value |
|---|---|---|
| 11 | 00 | +3 |
| 10 | 01 | +1 |
| 00 | 10 | −1 |
| 01 | 11 | −3 |

Digital filter 3 handles the dibits according to the numerical value which is indicated in the third column.

The coding of the output dibits ($a_0a_1$) is such that the numerical value is indicated by:

$$2 \cdot (-1)^{a_0} + (-1)^{a_1}$$

The multiplication of a dibit by a filter coefficient $C_k$ can now be performed in two stages, namely first multiplication of $C_k$ by 2 and the addition of a sign corresponding to $(-1)^{a_0}$, thereafter multiplication by 1 and the addition of a sign, corresponding to $(-1)^{a_1}$. The multiplication of a binary number by 2 corresponds to a one-place shift of the decimal points so that, when the above code is used, a simple decimal point shift arrangement can be used instead of a multiplier.

Relation between line carrier frequency and data rate

From FIG. 2 it is clear that the line carrier frequency of 2100 Hz is equal to the difference between the frequency of carrier wave source 6 of 6900 Hz and the frequency of 4800 Hz corresponding to the center of one of the Nyquist edges of the VSB filter according to FIG. 2b.

If now the line carrier frequency is indicated by $f_c$, the frequency of the carrier wave source 6 by $\frac{1}{2}f_2$ and the frequency corresponding to the center of the Nyquist edge of the filter to FIG. 2b by $\frac{1}{2}Kf_1$, then the equation applies:

$$f_c = \frac{1}{2}f_2 - \frac{1}{2}Kf_1 \qquad 1.$$

With $f_c$ and $f_1$ given the relation between K and $f_2$ is fully determined by equation (1).

When in expression (1) we substitute $f_c = 2100$ Hz and $f_1 = 2400$ Hz, then it will be found with $K = 4$ that $f_2 = 13800$ Hz.

The factor by which digital, filter 3 increases the sampling frequency then is:

$$f_2/f_1 = 23/4 \qquad 2.$$

The factor K may be an odd number. In this case, the spectrum according to FIG. 2a must be shifted to the rifht over an interval $\frac{1}{2}f_1$. This can be realized by multiplying the output samples of sampler 4 alternately by +1 and −1.

Digital filter

Digital filter 3 according to FIG. 1, with an increase of the sampling frequency by a factor M/L, which in the example amounts to 23/4, can be realized by means of a cascade of an interpolating filter which increases the sampling frequency by a factor M and an extrapolating filter which decreases the sampling frequency by a factor L. The transfer function which must be realized can then be divided between the two filters.

An other possibility would be to replace the extrapolating filter by a switch, which is operated at a frequency which is a factor L lower than the output sampling frequency of the interpolating filter and which supplies only one of each group of L output signal samples to modulator 5.

Interpolating and extrapolating digital filter are known as such and it may here suffice to refer to the references mentioned sub (C).

An attractive version of an interpolating digital filter has been described in U.S. Ser. No. 607,611, filed Aug. 25, 1971.

Although Applicant has refrained from describing known digital filters, it should be noted that, because in digital filters output signal samples are calculated from input signal samples on the basis of numbers, it will be clear to one, skilled in the art that the multiplication of the output signal samples of digital filter 3 by the carrier wave samples of carrier wave source 6, can be performed in the digital filter 3.

Pilot signal

In practice a pilot signal is sent with the modulated data signals on the line carrier frequency (2100 Hz, FIG. 2d). Such a pilot signal can be produced in various ways. An attractive method for the production of the pilot signal is the following.

The numerical values of the signal samples which are supplied by sampler 4 to digital filter 3, are increased by a fixed amount. This causes spectral lines in the frequency spectrum to be produced according to FIG. 2a at the frequencies $f_1$, $2f_1$, ... The spectral line at $2f_1$ (= 4800 Hz) shifts by modulation with the spectral line at 6900 Hz of carrier wave source 6 (FIG. 2c), to the line carrier frequency of 2100 Hz (FIG. 2d) and forms here the desired pilot signal. In the case of the 4800 bit/sec data transmitter a conversion aof the numerical values +3, +1, −1, −3 to +4, +2, 0, −2 results in a pilot signal which is 6 dB below the maximum signal level.

What is claimed is:

1. Modulation- and filtering device for digital signals comprising means for filtering the digital signals and means for modulating the filtered digital signals, on a modulator carrier wave characterized in that signal samples of the digital input signal, which occur at a first sampling frequency are converted in a digital filter to signal samples of a second sampling frequency, which is twice as high as the modulator carrier wave frequency and the signal samples at the second sampling frequency are modulated in the modulator with signal samples of the modulator carrier wave which occur at the same second sampling frequency the digital filter being adapted to have a band-pass filter characteristic.

* * * * *

UNITED STATES PATENT AND TRADEMARK OFFICE
CERTIFICATE OF CORRECTION

PATENT NO. : 4,003,002
DATED : January 11, 1977
INVENTOR(S) : WILFRED ANDRE MARIA SNIJDERS ET AL It is certified that error appears in the above-identified patent and that said Letters Patent are hereby corrected as shown below:

Col. 1, line 18, "AM-USB" should be --AM-VSB--;

Col. 2, line 5, "so" should be --of--;

line 42, "freuency" should be --frequency--;

line 67, "It" should be --If--;

Col. 3, line 3, "and" should be --an--;

line 17, "AV-" should be --AU- --;

Col. 4, line 24, ". the" should be --. The--;

line 32, "$T_2$ " $1/f_2$" should be --$T_2 = 1/f_2$--;

Col. 5, line 51, "rifht" should be --right--;

Signed and Sealed this

Twenty-ninth Day of March 1977

[SEAL]

Attest:

RUTH C. MASON
*Attesting Officer*

C. MARSHALL DANN
*Commissioner of Patents and Trademarks*